United States Patent [19]
Hoang

[11] Patent Number: 5,942,795
[45] Date of Patent: Aug. 24, 1999

[54] LEADED SUBSTRATE CARRIER FOR INTEGRATED CIRCUIT DEVICE AND LEADED SUBSTRATE CARRIER DEVICE ASSEMBLY

[75] Inventor: Lan H. Hoang, San Jose, Calif.

[73] Assignee: National Semiconductor Corporation, Santa Clara, Calif.

[21] Appl. No.: 08/887,955

[22] Filed: Jul. 3, 1997

[51] Int. Cl.[6] .......................... H01L 23/48; H01L 23/52
[52] U.S. Cl. .................. 257/692; 257/691; 257/693; 257/696; 257/735; 257/736; 257/701
[58] Field of Search .................... 257/691–693, 257/696, 697, 735–738, 701–703, 733

[56] References Cited

U.S. PATENT DOCUMENTS

| | | | |
|---|---|---|---|
| 5,710,459 | 1/1998 | Teng et al. | 257/717 |
| 5,736,781 | 4/1998 | Atsumi | 257/679 |
| 5,773,882 | 6/1998 | Iwasaki | 257/692 |
| 5,777,387 | 7/1998 | Yamashita et al. | 257/737 |
| 5,789,810 | 8/1998 | Gross et al. | 257/704 |
| 5,854,512 | 12/1998 | Manteghi | 257/735 |

*Primary Examiner*—Mahshid Saadat
*Assistant Examiner*—Allan R. Wilson
*Attorney, Agent, or Firm*—Beyer & Weaver, LLP

[57] ABSTRACT

Leaded substrates carriers and packaged integrated circuit devices that utilize such carriers as well as method of manufacturing the same are disclosed. The substrate carrier comprises a series of conductor lines for electrically connecting the active side of the chip to leads formed as part of the substrate carrier and extending from the side of the substrate carrier. The leads extend beyond the sides of the substrate carrier and have planar metal surfaces designed to allow surface mounting and testing of the assembly.

13 Claims, 6 Drawing Sheets

5,942,795

LEADED SUBSTRATE CARRIER FOR INTEGRATED CIRCUIT DEVICE AND LEADED SUBSTRATE CARRIER DEVICE ASSEMBLY

FIELD OF THE INVENTION

This invention relates generally to a leaded substrate carrier and its use with an integrated circuit device assembly mounted face down, and more particularly to such a carrier and its use with a flip chip mounted thereon, for example, as used in standard consumer electronics and miniature packages and a method of manufacture thereof.

BACKGROUND OF THE INVENTION

One of the techniques presently employed to interconnect the dice to the substrate carriers in surface mount devices with the active surfaces of the dice facing away from the substrate carriers is to employ a wire bonding connection. This system of interconnect, particularly in miniature packages, has limitations with respect to both thermal and electrical performance. The wire bonding system also inherently provides a thicker package than what is sometimes desirable and requires a more complicated and involved manufacturing process than, for example, what would be involved with an interconnection employing electrical conducting substrate carrier bumps and chip pads. The lack of leads in the wire bonding system makes for difficulty in testing and inspection and hence in the reliability characteristics of the integrated circuit device assembly.

In addition, in the case of very small surface mount dice, i.e. high pin count density or high number of I/O terminals for small die area manufacturing, cost becomes a concern when utilizing the wire bonding interconnection technique. Another concern present in the employment of the wire bonding system is the limitation imposed with respect to the die/footprint ratio which is inherent relatively small.

SUMMARY OF THE INVENTION

With the forgoing in mind, the present invention provides a leaded substrate carrier and an integrated circuit device assembly used with it and a method of manufacture the same. More particularly, the invention provides a leaded laminated substrate carrier for an integrated circuit (as for example a flip chip) and the combination thereof. The substrate includes imbedded conductor lines for the input/output (I/O) terminals of the chip and surface mount leads that are electrically connected to respective conductor lines extend outwardly of the main body of the substrate carrier.

In preferred embodiments, the die and the leaded substrate carrier are electrically coupled in a manner that does not require a wire bonding technique but instead employs a substrate carrier that allows the use of leads as the surface mounted interconnect with the printed circuit board. In this embodiment, electrical connection pads are provided on the die side of the substrate carrier that mate with bumps provided on the adjacent active surface of the chip.

In another preferred embodiment a heat sink on the substrate carrier are coupled to thermal bumps on the die by thermal vias to provide improved heat dissipation.

An additional feature of the invention is to provide a simplified and cost effective manufacturing process for the leaded substrate carrier and for the chip device described above an, one that will allow a number of substrate carriers to be manufactured in strip or panel form with exposed surface mount leads, including the attachment of chips to a designated substrate carrier while in such form.

BRIEF DESCRIPTION OF THE DRAWINGS

These objects and advantages, as well as others, will be better understood when the following detail description of the preferred embodiment of the invention is read along with the accompanying drawings of which.

DESCRIPTION OF THE PREFERRED EMBODIMENT OF THE INVENTION

Figure 1:
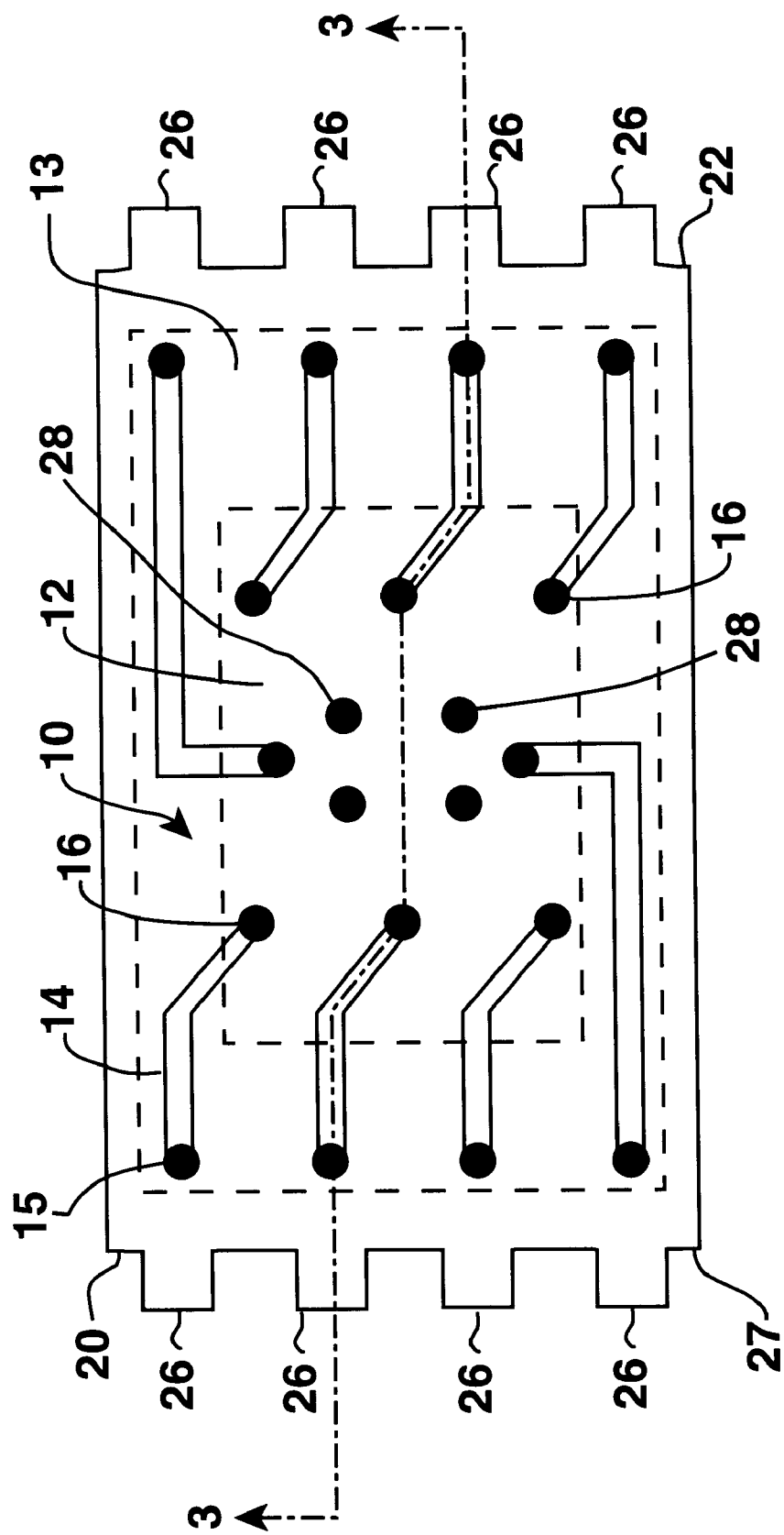
FIG. 1, is a schematic top plan view of a flip chip substrate carrier device assembly incorporating the features of the present invention.
Figure 2:
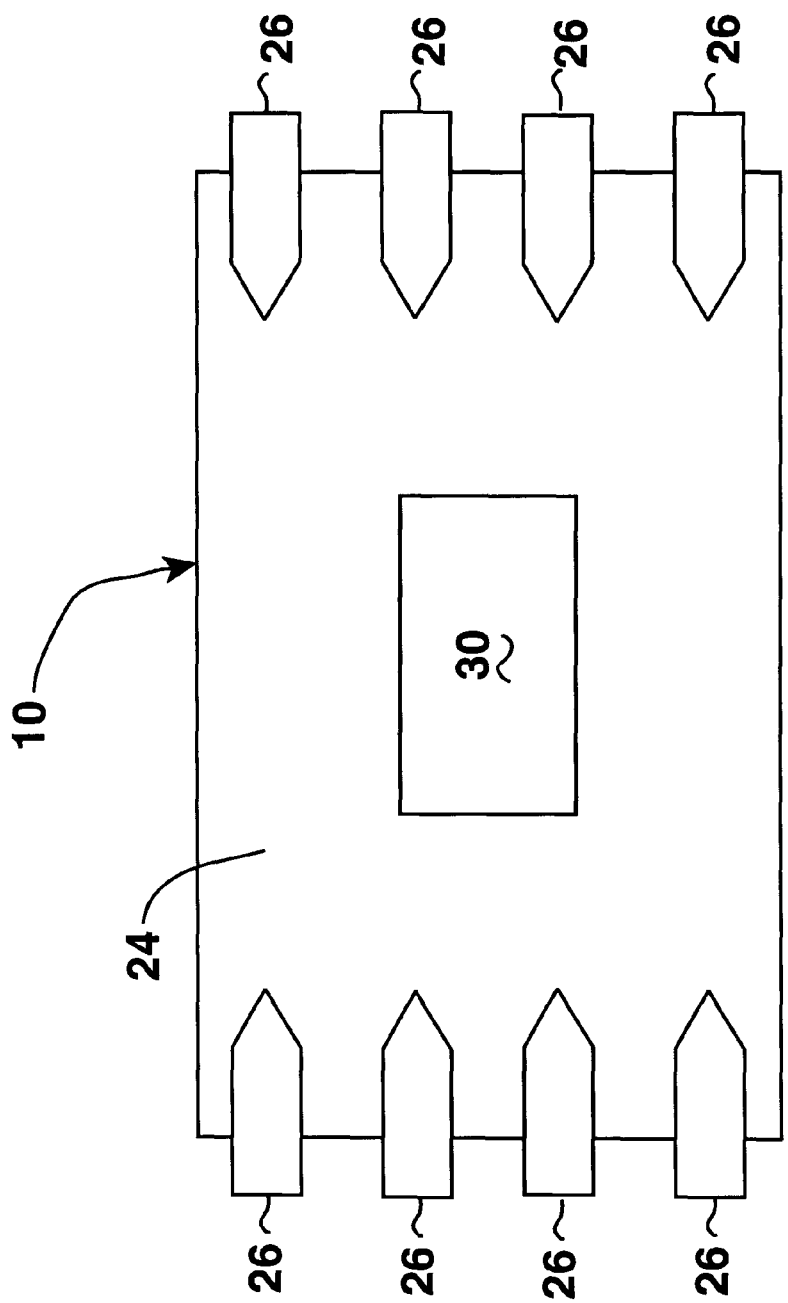
FIG. 2, is a schematic bottom plan view of the assembly shown in FIG. 1, FIG. 3, is a schematic section view taken on line 3—3 of FIG. 1, FIGS. 4a and 4b are a schematic plan views of a substrate carrier panel illustrating nine substrate carriers and associated chips, and particularly the formation of the surface mount extended leads of the individual substrate carriers prior to and after the singulation step respectively.
Figure 3:
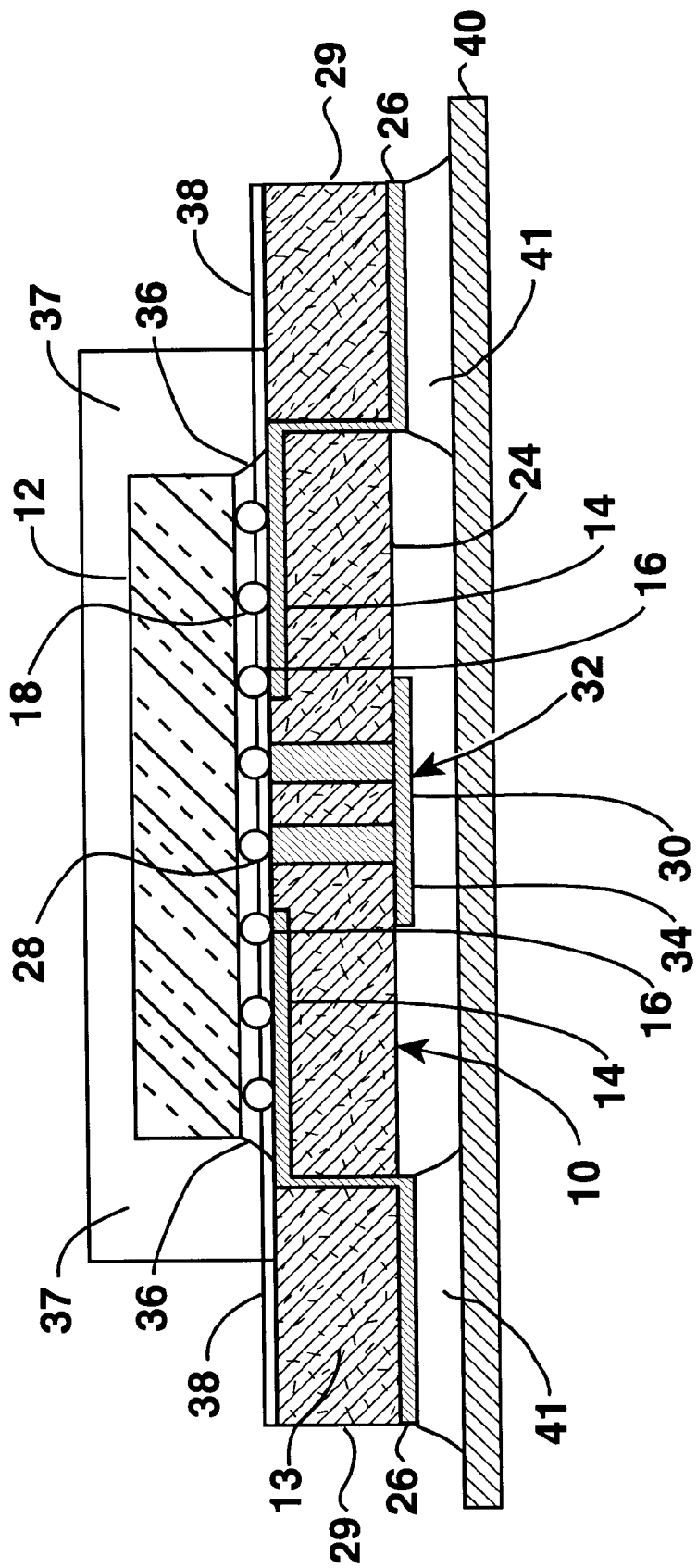

With reference to FIGS. 1, 2 and 3, there is schematically illustrated a laminated rectangularly shaped substrate carrier 10 after separated from a panel of which it was one a number of formed substrate carriers during a prior panel forming process to be discussed later. The substrate carrier can be formed from several well-known materials, for example BT resin, FR-4, Polyimide or glass epoxy material. During the substrate carrier panel forming process, each substrate carrier is formed with a body portion provided with a conductor line (trace) for each I/O terminal of a rectangularly shaped flip chip die 12, several lines being shown at 14 in FIG. 1, and two also appearing in FIG. 3. In FIG. 1 the inner ends of the conductor lines form interconnection pads 16 that are electrically connected to the I/O terminals of the die 12. The outer ends of the conductor lines are coupled to electrical vias 15.

In the embodiment shown, the conductor lines are imbedded in the substrate, but in alternative embodiments they may be formed on the substrate surface. The inner ends of the conductor lines 14 form interconnection pads 16, which mate with bumps 18 formed on the bottom active surface of the die 12. The bumps 18 may be formed during the wafer process by a well known procedure. It will be appreciated that other interconnections can be employed such as conductive adhesives. The connection pads and bumps and conductor lines may be formed from well-known materials such as copper, nickel and gold coating. The use of the pad-bump connection allows a larger cross section connection area for improved signal transmission over a bonded wire system. The employment of flip chip solder balls or bumps results in lower inductance and resistance compared with standard wire bonding. Another feature of such employment is found in the benefit that the electrical path the signal has to travel is shortened. In devices constructed in accordance with the invention where there is a high bump density on the wafer, the bumping cost will be reduced for each I/O interconnection. Also in such devices there will be no extra tooling cost for different packaging form factors. Traditionally, new tooling sets are required to handle different lead frames for different lead frames for different pin count packages. The present invention will allow for quick-turn designs to manufacture and improve time to market.

The conductor lines 14 extend outwardly from their respective pads 16 to a place inwardly of the two opposed sides 20 and 22 of the substrate carrier where they couple to vias 15 that project downwardly through the substrate carrier to its bottom surface 24 at which location the vias electrically contact with different surface mount leads 26. The leads are formed as part of the substrate carrier material and are an integral part thereof, as best shown in FIGS. 1 and 2. The thickness of the leads may be substantially the same as the substrate, as for example, between approximately 0.05 mm to 0.5 mm. The leads extend out beyond the sides 20 and 22 of the main body 27 of the substrate carrier 10 a significant distance, the distance as an example in the device shown being 0.30 mm for a substrate carrier measuring 3.00 mm on the short side and 4.90 mm on the long side, again these dimensions being only typical examples.

The leads 26 are portions of the substrate carrier 10. The lower or outer and, if desired the upper or inner surfaces i.e. relative to the bottom surface of the substrate carrier, of the exposed extending ends of the leads have exposed metal surfaces of sufficient metal type, thickness and adherence to assure good signal transmission. Any suitable metal may be used, as for example, Cu, Au or Ni and can be applied by a plating process. In the described embodiment, plating processes of up to 5 microns are used, the presence of which will permit quick, easy and reliable testing and inspection by standard well known sockets. Testing and burn-in can be done with standard sockets where the electrical pins clamp the leads on the periphery of the package. The top side of leads 26 can be metal exposed to allow two electrical point contacts. This ensures a better contact as well as allows for two point Kelvin testing. The metal plating step is part of the substrate carrier panel forming operation. The leads will allow visual inspection of the solder joints following surface mount reflow to insure solder joint integrity. Another benefit gained by the employment of a carrier interposer, the conductor line-lead arrangement and interconnection system of the invention is the larger die/footprint ratio realized, which allows a larger die to fit in a smaller package which is important in consumer portable products where the printed circuit board is costly real estate and which also allows for utilization of multi-chip modules in miniature packages.

As shown in FIG. 2, the underneath surfaces of the leads 26 are formed to have a substantial width, for example, 0.30 mm, the adjacent leads being separated from each other by, for example, a center to center pitch of 0.65 mm. The width dimension allows the advantage of a larger cross-section area for better signal transmission and improving reliability, the relationship of the leads to pitch being at least one third of the pitch. It will be appreciated that, if desired, the leads can be arranged on one or all four sides of the substrate carrier. The thickness of the substrate carrier portion of the lead shown in FIG. 3 can range from 0.05 mm to 0.5 mm, as an example.

In the embodiment shown, the flip chip die 12 is provided with a thermal management system comprised on its active surface with, for example, four centrally located physically interconnected thermal bumps 28, which as indicated in FIG. 3 are arranged in contact with a heat sink 30 having a portion 32 in contact with and extending from the die 12 that extends through the substrate carrier 10 at its center. The heat sink has two horizontal portions 34 that extend to and terminates below the bottom surface 24 of the substrate carrier. This thermal control construction allows for improved thermal die enhancement. In conjunction with the horizontal portions 34 thermal vias can be placed in the substrate carrier to take the heat of the die directly to the printed circuit board. In the case of a bare die i.e. an unencapsulated die, thermal enhancement can be achieved by arranging a heat spreader on top of the silicon die.

In FIG. 3, the flip chip die 12 is shown to be encapsulated by an underfill portion 36 and an encapsulation 37. As will be appreciated by those skilled in the art, the underfill portion 36 and the encapsulation 37 each are typically formed of any suitable encapsulating material such as epoxy using well known processes. At the surface of the substrate there is provided a protective solder mask 38 creating a mechanical protection for the substrate which is applied at the panel forming stage. FIG. 3 also indicate a portion of a well known type printed circuit board 40 on which the leads 26 of the substrate carrier 10 are surface mounted by, for example, a well known wave soldering process. The leads and boards are separated in a well-known manner by solder 41.

Figure 4A:
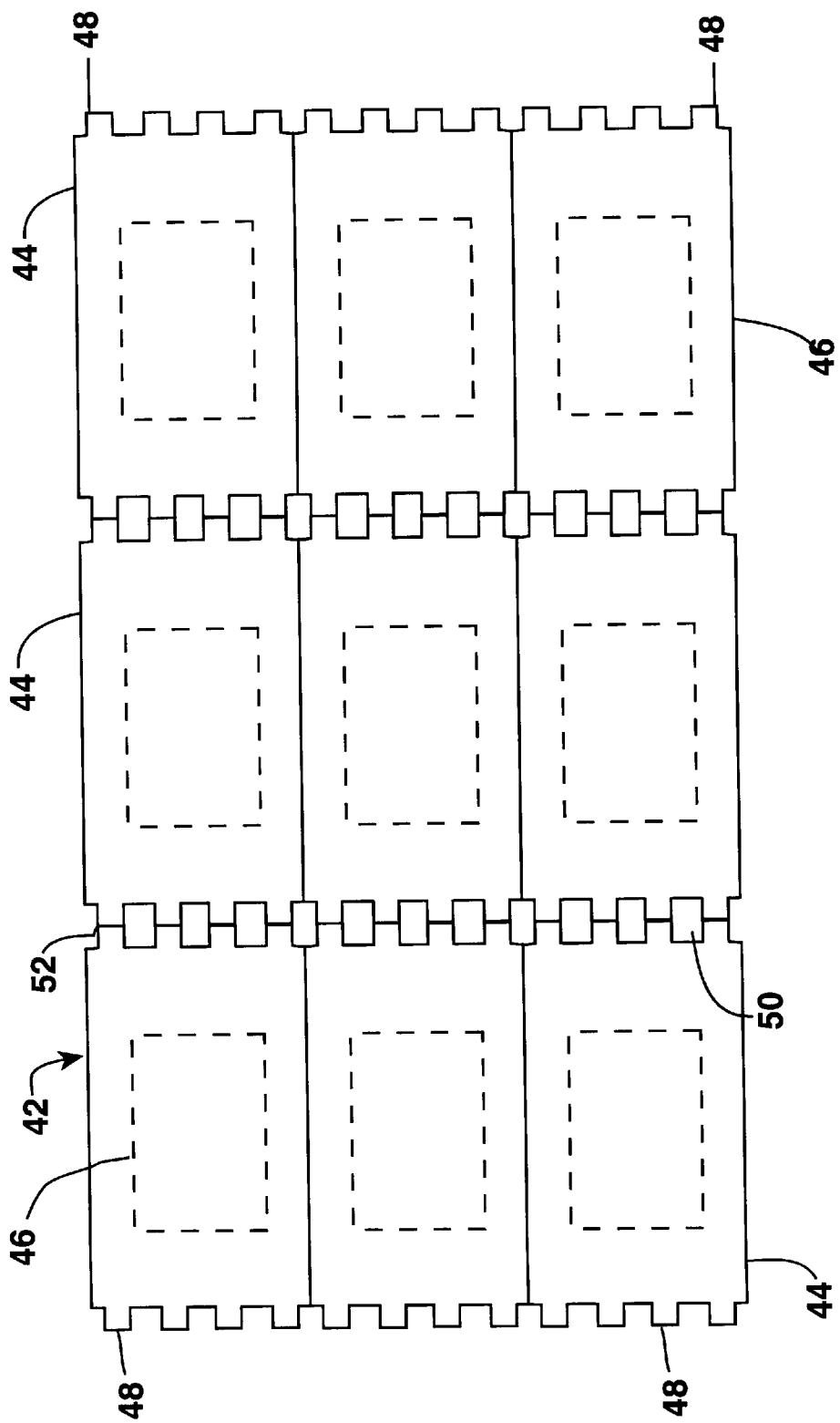
Figure 4B:
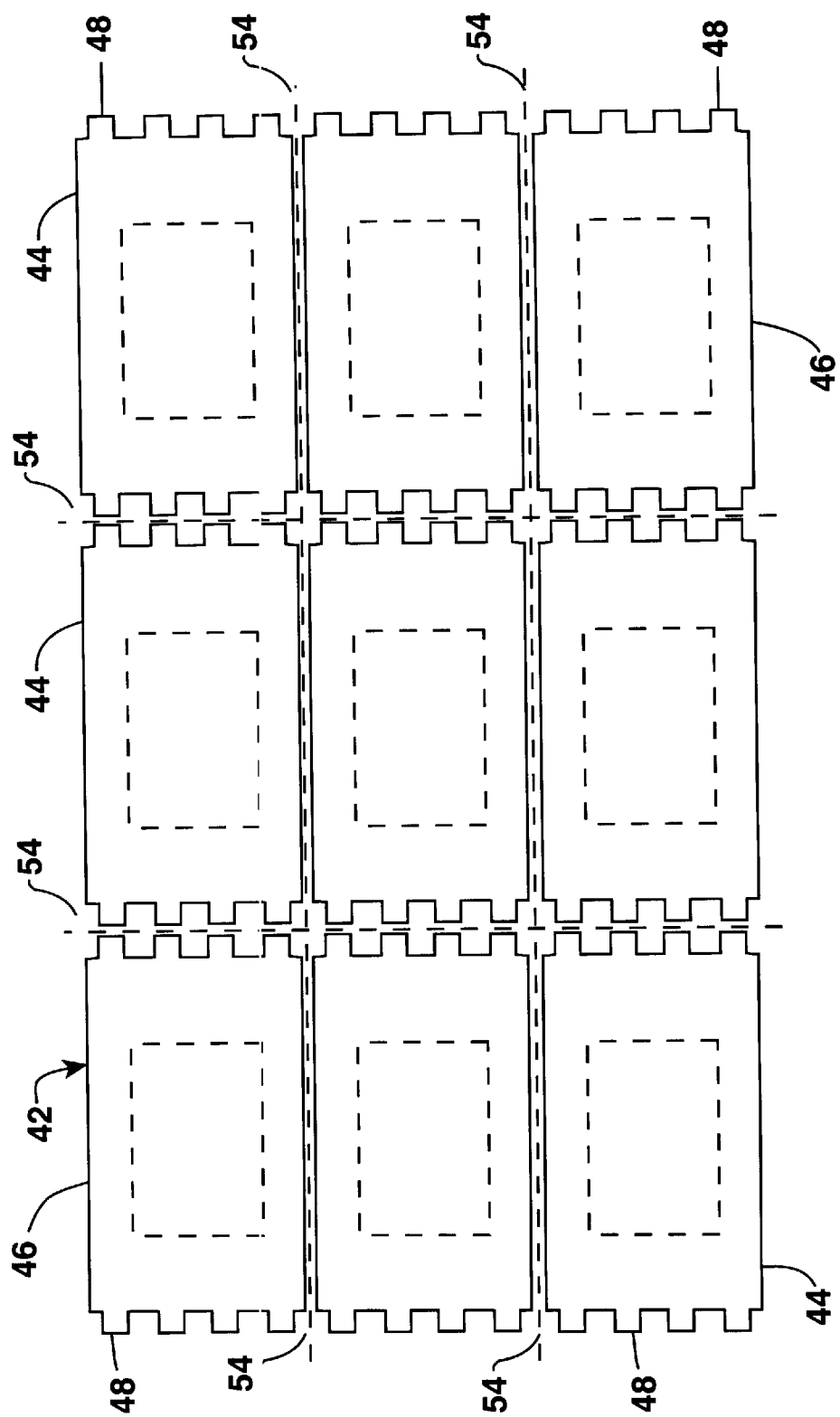

With reference now to FIG. 4 there is schematically illustrated a laminated substrate carrier panel 42 having integrally formed, an array of substrate carrier units 44 similar to the substrate carrier 10. In the embodiment shown, a three by three portion of the array is illustrated. However, it should be appreciated that the number of substrate carrier units in any given panel may vary greatly in accordance with the required substrate carrier sizes and the available panels sizes. Generally, it is contemplated that relatively large arrays may be provided.

As shown, the substrate carriers in any given row of substrate carriers are all connected to a common portion of the panel. The panel forming procedure allows the full utilization of the substrate carrier material and hence a substantial cost saving. Each substrate carrier unit is shown to carry a chip 46 similar to the chip 12. Prior to the attachment of the chips to their respective substrate carrier units, the panel is presented to a die punch where material 50, that is the substrate carrier material on either side of the portions 29 and the lead portions directly underneath such material provided to form the leads on the opposite ends of each substrate carrier, are simultaneously removed by a one step operation. As shown in FIG. 4, after this operation what remains are the leads 48 and the portions 29 on each of the opposite sides of each substrate carrier unit. After this removable operation the substrate carriers remain connected by the thin amount of lead and substrate carrier material 52 existing between opposed adjacent leads 48, that is to say the leads of the three center substrate carrier units are connected to the opposed leads of the right and left hand substrate carrier units, as one views FIG. 4. As a result, the only operation needed to separate the nine units 44 to free the packages are four quick and simple wafer cutting operations along the four cut lines 54. This method of forming the leads allows the use of very flexible leads of very thin construction that reduces stress between the solder and leads when the package is soldered to the printed circuit board.

Figure 5:
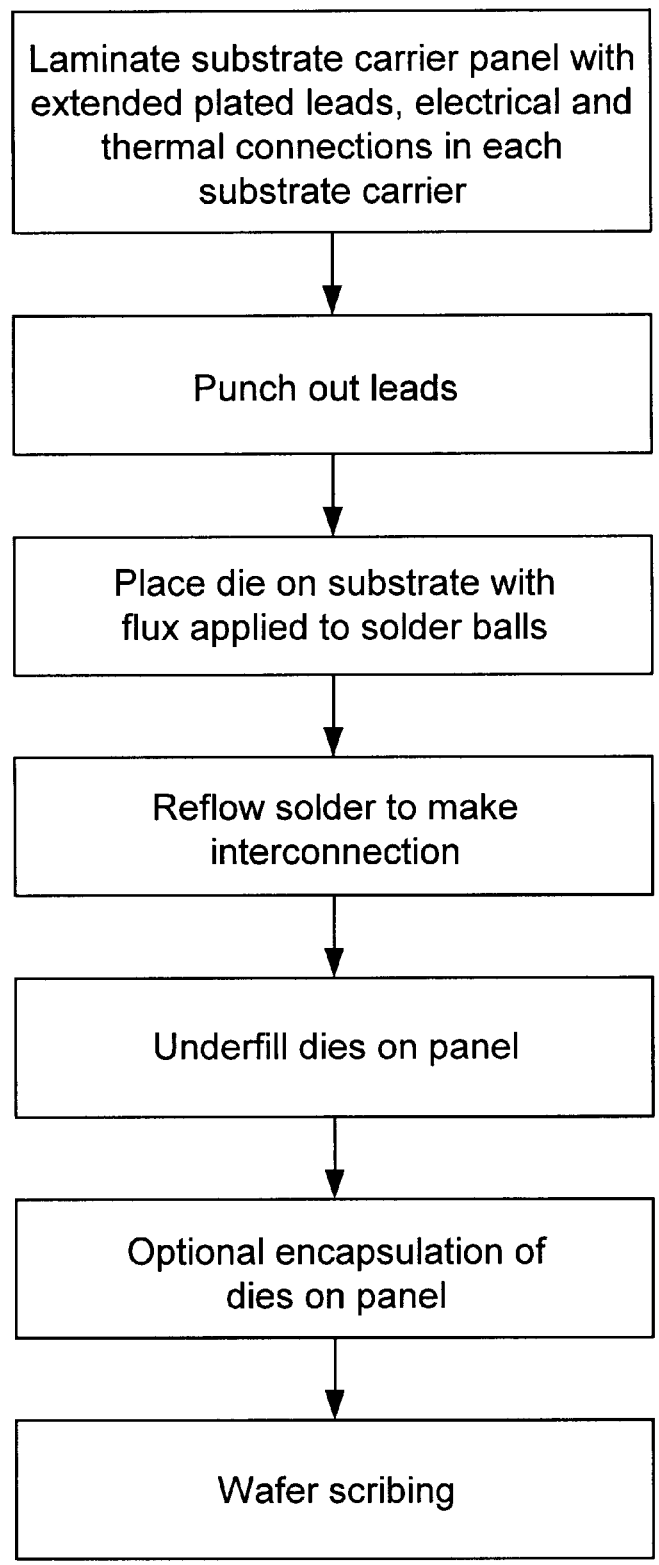
FIG. 5, is a flow chart of the manufacture process of the substrate carrier and of the combination of the substrate carrier and flip chip device shown in the previous figures.

As used herein the reference to a panel is meant to include a strip of substrate carrier units, for example, two or three of the upper most attached units shown in FIG. 4 having the same singulation cut lines 54. A further understanding of the method of manufacturing the integrated circuit substrate carrier device assembly can be had by reference to the flow chart appearing in FIG. 5. In the panel forming operation the extended leads made out of the substrate material, the plated metal surfaces and the electrical circuits, heat sink elements and encapsulation, if required, of the packages are formed or applied by well known techniques to each substrate carrier unit, after which the leads are punched out as above described before the flip chip dies are secure to their respective substrate carriers, and after which the solder operation will be performed. The other identified steps or procedures of the flow chart are all generally well known in the packaging art.

In accordance with the provisions of the patent statutes, I have explained my invention in terms of its preferred embodiment, however, it will be readily understood by those skilled in the art to which the invention pertains that it may be practiced otherwise than illustrated and described. It will also be appreciated by those skilled in the art that the examples given in the description of the invention are only examples and not limitations thereof.

I claim:

1. A semiconductor device assembly comprising:

an integrated circuit comprising an active surface having a series of electrical bumps, a nonconductive substrate carrier for said integrated circuit comprising a first surface arranged in a supporting relationship to said integrated circuit, said first surface comprising a series of conductor lines, wherein each said conductor line is in electrical contact with at least one associated electrical bump of said active surface, said nonconductive substrate carrier comprising a second surface arranged generally parallel to and opposite said first surface and spaced therefrom, said second surface comprising a series of spaced apart leads comprising a first portion, wherein each said spaced apart lead is in electrical contact with at least one associated conductor line of said first surface, each said spaced apart lead comprising a second portion extending outwardly from at least one side of said nonconductive substrate carrier, said second portions of said spaced apart leads comprising opposed inner and outer planar surfaces, and said outer planar surfaces comprising a metal surface and arranged to facilitate surface mounting said assembly.

2. A semiconductor device assembly according to claim 1, wherein said nonconductive substrate carrier includes a laminated structure.

3. A semiconductor device assembly according to claim 1, wherein said metal surfaces of said outer planar surfaces comprise plated metal surfaces and said inner planar surfaces of said spaced apart leads each comprise plated metal surfaces.

4. A semiconductor device assembly according to claim 1, wherein said integrated circuit comprises of a plurality of additional bumps, said nonconductive substrate carrier comprises of a second side opposite said first side thereof, said conductor lines comprise an additional series of conductor lines, one for each said additional bump, and said spaced apart leads comprise an additional series of leads arranged on said second side of said nonconductive substrate carrier, one for each said additional conductor lines.

5. A semiconductor device assembly according to claim 4, wherein said second series of leads comprising other said second portions that extend beyond said second side of said substrate carrier.

6. A semiconductor device assembly according to claim 5, wherein said substrate carrier comprises a rectangular form, said conductor lines extending generally parallel to said first surface of said substrate carrier comprising first ends arranged generally adjacent the perimeter of said rectangular form outside of the boundary of said integrated circuit and second ends arranged within the boundary of said integrated circuit, and said bumps of said integrated circuit contacting a said associated conductor lines within the boundary of said integrated circuit.

7. A semiconductor device assembly according to claim 1, wherein said integrated circuit comprises at least one thermal bump, said nonconductive substrate carrier comprises a heat sink comprising a first portion in physical contact with said thermal bump and a second portion exposed to said second surface of said nonconductive substrate carrier.

8. A semiconductor device assembly according to claim 1, wherein said spaced apart leads are separated by a pitch dimension, and said planar surfaces comprise a transverse dimension in a direction parallel to said one side measuring approximately at least one-third of said pitch of said spaced apart leads.

9. A semiconductor device assembly comprising:

an integrated circuit means comprising an active surface comprising a series electrical bump means, a nonconductive substrate carrier means for said integrated circuit means comprising a first surface arranged in a supporting relationship to said integrated circuit means, said first surface means comprising a conducting means for electrically contacting said bump means, said nonconductive substrate carrier means comprising a second surface arranged generally opposite said first surface and spaced therefrom, second surface comprising a spaced apart lead means comprising a first portion means for electrically contacting said conductor means, said spaced apart lead means comprising a second portion extending outwardly from at least one side of said nonconductive substrate carrier means, said second portions of said spaced apart lead means comprising opposed inner and outer planar surfaces, and said outer surface arranged to allow surface mounting of the assembly.

10. A substrate carrier for an integrated circuit device comprising:

a panel formed of a substrate carrier material, said panel comprising a number of discrete nonconductive substrate carriers arranged in a row, in which said row is an integral part of said panel and said discrete nonconductive substrate carriers are formed on a common portion of said panel, each said discrete nonconductive substrate carrier comprising a body portion, each said discrete nonconductive substrate carrier comprising a lead supporting portion and a lead portion both extending outwardly from at least one side of a said body portion, said lead portions comprising opposed planar surfaces, one of said planar surfaces arranged to allow surface mounting of said integrated circuit device, said one planar surface comprising a metal surface, and said lead portion comprising sections removed from said substrate carrier lead supporting portion and said lead portion to form a series of spaced apart discrete leads.

11. A packaged semiconductor device comprising:

a die having a plurality of contacts;

a nonconductive substrate carrier having a body portion that includes side portions and a plurality of spaced apart fingers that extend outwardly from the side portions of the body, the die being mounted on a first surface of the substrate carrier, wherein the first surface of the substrate carrier includes a plurality of conductors that are electrically coupled to associated ones of the contacts and the fingers include conductive leads formed on a second surface of the substrate carrier that is located opposite the first surface of the substrate carrier, and wherein at least some of the leads are electrically coupled to associated ones of the conductors through the substrate carrier.

12. A semiconductor device assembly according to claim 11, wherein said nonconductive substrate carrier includes a laminated structure.

13. A semiconductor device assembly according to claim 11, wherein said die includes at least one thermal contact, and said nonconductive substrate carrier includes a heat sink with a first portion in physical contact with said thermal contact.

* * * * *